United States Patent
Miya et al.

(10) Patent No.: US 7,503,978 B2
(45) Date of Patent: Mar. 17, 2009

(54) SUBSTRATE PROCESSING APPARATUS AND SUBSTRATE PROCESSING METHOD WHICH PERFORMS PREDETERMINED PROCESSING ON A SUBSTRATE WHICH IS POSITIONED APPROXIMATELY HORIZONTALLY AT A SUBSTRATE PROCESSING POSITION

(75) Inventors: Katsuhiko Miya, Kyoto (JP); Eiji Fukatsu, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 365 days.

(21) Appl. No.: 11/132,565

(22) Filed: May 19, 2005

(65) Prior Publication Data

US 2005/0284369 A1 Dec. 29, 2005

(30) Foreign Application Priority Data

Jun. 25, 2004 (JP) ............................. 2004-187557

(51) Int. Cl.
*B05C 13/02* (2006.01)

(52) U.S. Cl. .................. 118/500; 118/52; 118/319; 118/320

(58) Field of Classification Search .................. 118/52, 118/319, 320, 500; 134/902; 427/240; 396/611; 156/345.55; 414/222.01, 941, 903
See application file for complete search history.

(56) References Cited

U.S. PATENT DOCUMENTS 6,435,200 B1 * 8/2002 Langen ...................... 134/99.1

2003/0027094 A1 * 2/2003 Storm et al. ................... 432/5
2003/0037456 A1 * 2/2003 Hunter et al. ................. 34/230

FOREIGN PATENT DOCUMENTS

| JP | 57-52139 | 3/1982 |
| JP | 5-283327 | 10/1993 |
| JP | 10-275766 | 10/1998 |
| JP | 2845738 | 10/1998 |
| JP | 2003-297901 | 10/2003 |
| JP | 2003-324090 | 11/2003 |

* cited by examiner

*Primary Examiner*—Laura Edwards
(74) *Attorney, Agent, or Firm*—Ostrolenk, Faber, Gerb & Soffen, LLP

(57) ABSTRACT

As a substrate transportation robot transports an unprocessed substrate W to a substrate transfer position P1, inert gas ejected from a substrate floating head 71 toward the bottom surface of the substrate W floats up the unprocessed substrate W. Driven by an actuator 74, the substrate floating head 71 floating up the unprocessed substrate W then moves down. Upon arrival of the unprocessed substrate W at a substrate processing position P3, a bottom rim portion of the substrate W engages with support pins 3, and as the substrate floating head 71 further moves down, the unprocessed substrate W is transferred to and mounted on the support pins 3. The substrate W is thus positioned at the substrate processing position P3, whereby the bottom rim portion of the substrate W and an opposing surface 5b of a spin base 5 are positioned close to each other and opposed against each other.

4 Claims, 6 Drawing Sheets

SUBSTRATE PROCESSING APPARATUS AND SUBSTRATE PROCESSING METHOD WHICH PERFORMS PREDETERMINED PROCESSING ON A SUBSTRATE WHICH IS POSITIONED APPROXIMATELY HORIZONTALLY AT A SUBSTRATE PROCESSING POSITION

CROSS REFERENCE TO RELATED APPLICATION

The disclosure of Japanese Patent Applications No. 2004-187557 filed Jun. 25, 2004 including specification, drawings and claims is incorporated herein by reference in its entirety.

BACKGROUND OF THE INVENTION

1. Field of the Invention

The invention relates to a substrate processing apparatus and a substrate processing method which performs processing such as cleaning on various types of substrates such as semiconductor wafers, glass substrates for photomask, glass substrates for liquid crystal display, glass substrates for plasma display and optical disk substrates.

2. Description of the Related Art

Conventional substrate processing apparatuses of this type include a substrate processing apparatus in which a substrate such as a semiconductor wafer is horizontally held as it is slightly floated from a support base (base member) which is to seat substrates, and the top surface of the substrate is processed as a processing liquid such as a photo-resist liquid and a cleaning liquid is supplied to the top surface of the substrate or using a cleaning mechanism such as a cleaner brush while rotating the support base. In the substrate processing apparatus described in Japanese Patent Application Laid-Open Gazette No. H10-275766 for instance, plural substrate support pins are disposed upright on a support base, and a substrate is positioned and held as the substrate support pins abut on a rim portion of the substrate. The top surface of the substrate is then processed, as a processing liquid is supplied or with the cleaning mechanism abutting on the substrate while rotating the substrate. In the conventional apparatus, since a substrate is held as it is slightly floated from a surface of the support base as described above, the bottom surface of the substrate is protected against a damage, contamination and the like which will occur if the substrate is mounted on the support base in contact with the support base.

SUMMARY OF THE INVENTION

By the way, in the conventional apparatus, a substrate is held by the substrate support pins as it is floated from the surface of the support base, and at this substrate processing position, the substrate is subjected to a predetermined surface treatment (substrate processing). In short, the substrate is positioned to the substrate processing position which is spaced upward apart from the support base, and the surface treatment is executed. A substrate transportation mechanism such a transportation arm loads a substrate onto the substrate support pins and receives a substrate which is supported by the substrate support pins. To be more specific, the transportation arm is inserted into the space which is created between a substrate which is at the substrate processing position and the support base, to thereby load and unload the substrate. To permit entry of the transportation arm, the space between the substrate and the support base needs be larger than the height of the transportation arm along the up-down direction. Due to this however, the height of the transportation arm along the up-down direction restricts the substrate processing position and the substrate and the support base can not come close enough to each other. The following problem therefore arises. That is, when the gap between the substrate and the support base grows relatively wide, the mist-like processing liquid splashed during substrate processing, particles and the like flow beneath and adhere to the bottom surface of the substrate and the bottom surface of the substrate is contaminated.

To prevent contamination of the bottom surface of the substrate, ascend/descend members such as lift pins may be disposed to the support base, the lift pins may be driven to move upward to receive the substrate and downward to reduce the gap between the substrate and the support base. However, this solution requires contact of the lift pins with the bottom surface of the substrate, and the lift pins themselves will damage or contaminate the bottom surface of the substrate. Further, the necessity of driving the lift pins upward and downward makes the structure complex, which creates more particles.

A primary object of the invention is to provide a substrate processing apparatus in and a substrate processing method which a substrate is positioned at a desired substrate processing position without contacting anywhere.

To achieve the object above, the present invention is directed to a substrate processing apparatus which performs predetermined processing on a substrate which is positioned approximately horizontally at a substrate processing position, comprising: a base member which is provided underneath the substrate positioned at said substrate processing position and which is distanced from the substrate by a predetermined distance; a substrate floating device which includes a substrate floating head and which ejects out gas toward the bottom surface of the substrate at an ejection outlet which is formed in a support surface of the substrate floating head, thereby floating up the substrate approximately horizontally, the support surface which is faced against the bottom surface of the substrate; and an upward/downward driver which drives the substrate floating head along the up-down direction relative to the base member, thereby moving the substrate floated by the substrate floating head to a substrate transfer position, which is located above the substrate processing position, and to the substrate processing position and positioning the substrate at the substrate transfer position and the substrate processing position and at which a distance between the base member and the substrate is larger than a distance between the base member and the substrate positioned at the substrate processing position.

The substrate processing method comprises the step of: performing predetermined processing on a substrate which is positioned approximately horizontally at a substrate processing position which is spaced apart upward from a base member by a predetermined distance; and driving a substrate floating head along the up-down direction relative to the base member while floating up the substrate approximately horizontally by ejecting out gas toward the bottom surface of the substrate at an ejection outlet which is formed in a support surface of the substrate floating head, the support surface which is faced against the bottom surface of the substrate, thereby moving the substrate to a substrate transfer position, which is located above the substrate processing position, and to the substrate processing position and positioning the substrate at the substrate transfer position and the substrate processing position.

In this structure according to the invention, the gas ejected toward the bottom surface of the substrate from the substrate floating head floats up the substrate approximately horizontally over the support surface of the substrate floating head. Hence, the substrate is supported by the substrate floating head without contacting the substrate floating head. As the substrate floating head is driven relative to the base member along the up-down direction, the substrate thus supported without contacting anywhere is moved to and positioned at the substrate transfer position, which is above the substrate processing position, and the substrate processing position. Since the substrate is transferred at the substrate transfer position which is above the substrate processing position, the condition at the time of transfer of the substrate such as the height of the substrate transportation mechanism (transportation arm or the like) along the up-down direction does not restrict the substrate processing position, and therefore, it is possible to position the substrate at the substrate processing position as desired. Owing to this, a position at which the base member and the substrate come sufficiently close to each other can serve as the substrate processing position. In this manner, the substrate is positioned at the substrate processing position which is close to the base member without contacting the base member, which prevents troubles such as damaging, contamination and the like of the bottom surface of the substrate.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

DETAILED DESCRIPTION OF THE PREFERRED EMBODIMENTS

<Substrate Processing Apparatus>

Figure 1:
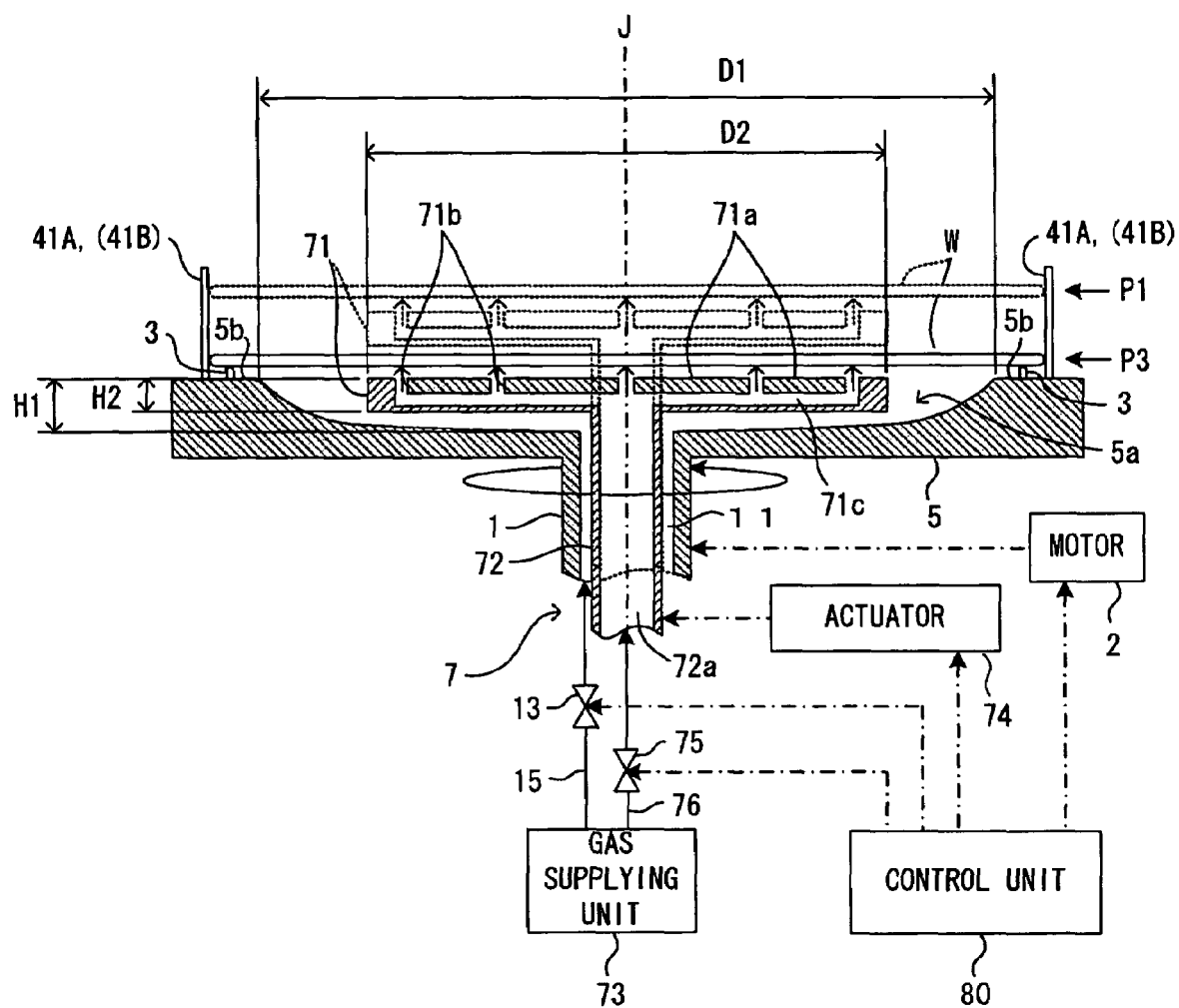
FIG. 1 is a drawing which shows an embodiment of a substrate processing apparatus according to the invention.
Figure 2:
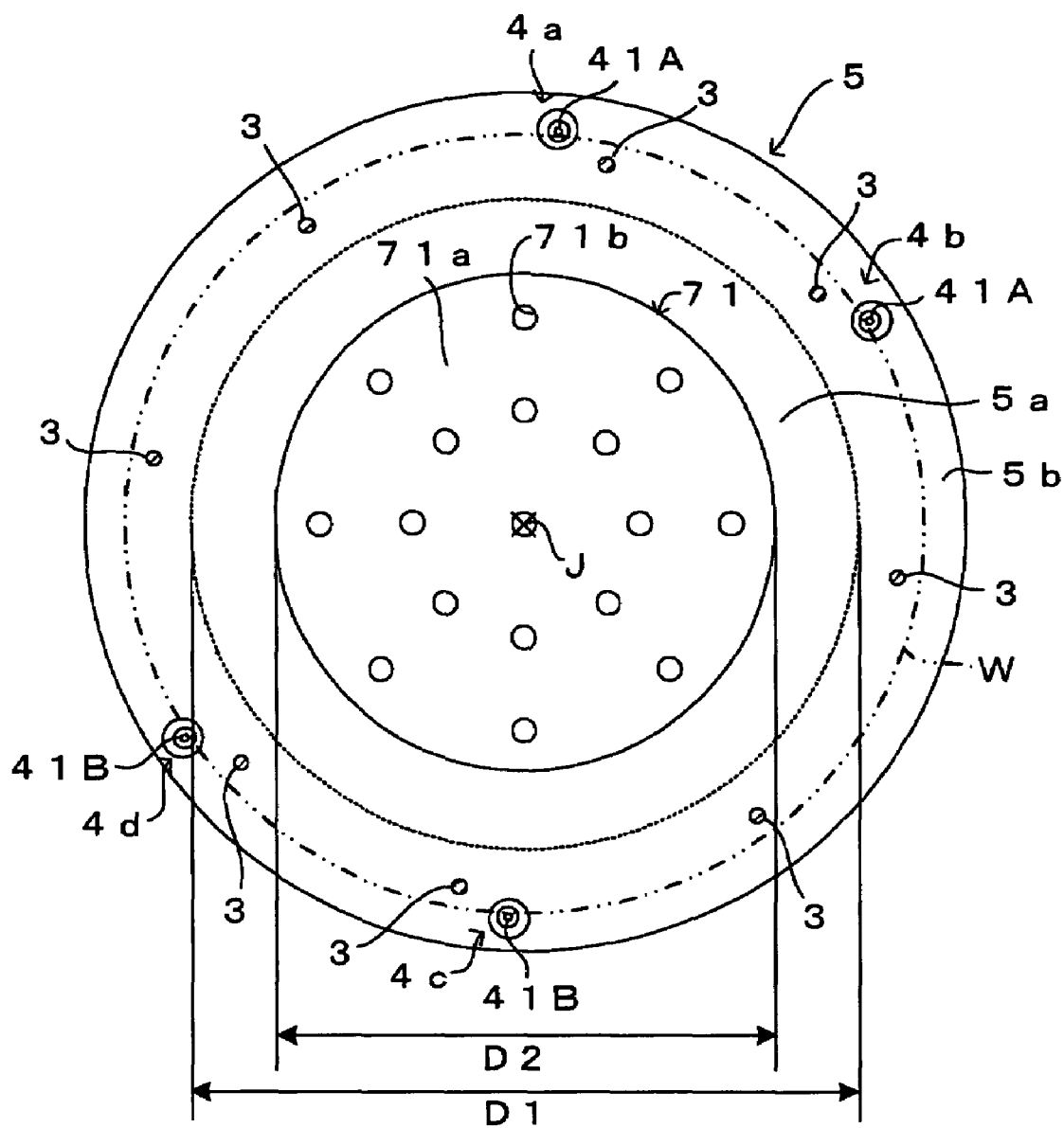
FIG. 2 is a plan view of the substrate processing apparatus of FIG. 1 as it is viewed from above.

FIG. 1 is a drawing which shows an embodiment of a substrate processing apparatus according to the invention. FIG. 2 is a plan view of the substrate processing apparatus of FIG. 1 as it is viewed from above. This substrate processing apparatus is an apparatus in which a chemical solution of a chemical substance, an organic solvent or the like and a rinsing liquid which may be pure water or DIW (hereinafter referred to as "processing liquid(s)") are supplied to the front surface of a substrate W such as a semiconductor wafer, and the top surface of the substrate W and a bottom rim portion of the substrate W are chemically processed, rinsed and otherwise treated. In this substrate processing apparatus for instance, the top surface of the substrate W can be processed while supplying the processing liquid to the top surface. Further, after supplied to the top surface of the substrate W, the processing liquid moves from the top surface of the substrate W to the edge surface of the substrate W and circles down over to the bottom surface of the substrate W, so that the bottom rim portion of the substrate W is processed (bevel processing). Use of the processing liquid is not limiting: The front surface of the substrate W may be scrubbed with a scrub cleaner brush or vapor-processed while supplying vapor including a chemical solution and the like to the front surface of the substrate W.

In this substrate processing apparatus, a hollow rotation shaft 1 is linked to a rotation shaft of a motor 2, and when driven by the motor 2, the rotation shaft 1 rotates about a vertical axis J. A circular spin base 5, which is slightly larger in plane size than the substrate W and corresponds to the "base member" of the invention, is linked as one integrated part to the top end of the rotation shaft 1 by a fastening component such as a screw. Hence, when driven by the motor 2, the spin base 5 rotates about the vertical axis J. In the vicinity of a rim portion of the spin base 5, there are plural (eight in this embodiment) support pins 3 which are apart from each other by approximately equal angles (FIG. 2). At least three support pins 3 are needed to support the substrate W horizontally. Each support pin 3 is capable of abutting on the bottom rim portion of the substrate W, and these eight support pins 3 support the substrate W approximately horizontally with the back side (non-device surface) of the substrate W faced up. Hence, the substrate W is positioned approximately horizontally along the up-down direction at a position (substrate processing position P3) which is spaced upward from the spin base 5 by a predetermined distance. The structure of the support pins is not limited to such a structure which abuts on the bottom rim portion of the substrate W, but may be any structure which supports the substrate W such that the substrate W is slightly floated from the spin base 5.

To prevent the substrate W supported by the support pins 3 from moving in the horizontal direction, four holders 4a through 4d are disposed at the rim of the spin base 1 (FIG. 2). Of the four holders 4a through 4d, the holders 4a and 4b are fixed holders to which hold pins 41A abutting on and holding the substrate W are fixed, whereas the holders 4c and 4d are movable holders in which hold pins 41B are movable. The movable hold pins 41B are capable of moving away from and abutting on the edge surface of the substrate W in accordance with an operation signal from a control unit 80 which controls the apparatus as a whole. The control unit 80 realizes loading of the substrate W onto and unloading of the substrate W from the support pins 3 in such a condition that the movable hold pins 41B stay away from the edge surface of the substrate W. After the substrate W is mounted on the support pins 3, the movable hold pins 41B are positioned to substrate holding positions which abut on the edge surface of the substrate W. In consequence, the movable hold pins 41B pinch the substrate W together with the fixed hold pins 41A and hold the substrate W horizontally. In this embodiment, the substrate W is supported approximately horizontally by the eight support pins 3, and the four hold pins 41A, 41A, 41B, 41B restrict the substrate W from moving in the horizontal direction. As such holders, the substrate holding mechanism disclosed in Japanese Patent Application Laid-Open Gazette No. 2004-146708 is used for example. The number and the arrangement of the holders may be determined freely. For instance, three holders may be prepared of which two may be fixed holders and the remaining one may be a movable holder.

FIG. 1 will be described continuously. In this embodiment, since the support pins 3 support the substrate W, it is possible to support the substrate W such that the bottom surface (device surface) of the substrate W and the spin base 5 are close to each other. In other words, the position at which the bottom surface of the substrate W and the spin base 5 are close to each other may be served as the substrate processing position. However, when the bottom surface of the substrate W and the spin base 5 are close to each other, a transportation arm of a substrate transportation robot or the like can not be inserted into the gap between the two. Noting this, this embodiment uses a substrate ascend/descend mechanism 7 for the following substrate transportation, so that the bottom surface of the substrate W and the spin base 5 can move close to each other while transporting the substrate by means of a substrate transportation robot. In short, the substrate ascend/descend mechanism 7:

receives an unprocessed substrate W from the substrate transportation robot;

mounts the unprocessed substrate W thus received onto the support pins 3;

receives from the support pins 3 the processed substrate W treated through a predetermined substrate processing; and hands thus received processed substrate W to the substrate transportation robot.

The substrate ascend/descend mechanism 7 comprises a substrate floating head 71 which ejects inert gas such as nitrogen gas toward the bottom surface of the substrate W and floats up the substrate W approximately horizontally, a head support arm 72 which is hollow and cylindrical, attached to a lower portion of the substrate floating head 71 and supports the head, a gas supplying unit 73 which is connected with the hollow section of the head support arm 72 and capable of supplying the inert gas onto the substrate floating head 71 via the head support arm 72, and an actuator 74 such as an air cylinder which moves the substrate floating head 71 and the head support arm 72 along the up-down direction as one integrated unit. In this embodiment, the actuator 74 functions as the "upward/downward driver" of the present invention which moves the substrate floating head 71 upward and downward along the up-down direction.

The substrate floating head 71 is at its central bottom portion fixed to the top end of the head support arm 72 as one integrated unit, and supported horizontally by the head support arm 72. The head support arm 72 is disposed penetrating the hollow section of the rotation shaft 1 coaxially with the axial direction of a vertical axis J, such that the head support arm 72 can freely ascend and descend in the up-down direction. The head support arm 72 is linked with the actuator 74, and therefore, when the control unit 80 drives the actuator 74, the substrate floating head 71 and the head support arm 72 ascend and descend as one integrated unit along the up-down direction.

The substrate floating head 71 is shaped like a disk which is smaller than the plane size of the substrate W, and the top surface 71a of the substrate floating head 71 is, as the "support surface" of the invention, disposed facing the bottom surface of the substrate W. Plural gas ejection outlets 71b (which correspond to the "ejection outlets" of the invention) are formed in the top surface 71a of the substrate floating head 71 so that it is possible to eject the inert gas up along an approximately vertical direction toward the bottom surface of the substrate W. As the inert gas is thus supplied into the space which is created between the bottom surface of the substrate W and the top surface 71a, the substrate W floats up. When these gas ejection outlets 71b are disposed so as to be equidistant from each other along the circumference which is centered on the vertical axis J and is at any desired diameter on the top surface 71a or disposed coaxially in addition to that, it is possible to float up the substrate W approximately horizontally above the top surface 71a. To the extent that the inert gas is ejected toward the bottom surface of the substrate W and the substrate W floats up approximately horizontally, the number and the arrangement of the gas ejection outlets may be determined freely. The gas ejection outlets 71b are not necessarily limited to plural openings, but instead may be for example a single opening such as an opening which is formed like a complete ring and concentric about the vertical axis J. However, the plural gas ejection outlets are more advantageous in attaining a uniform gas ejection pressure.

Each one of the plural gas ejection outlets 71b formed in the top surface 71a of the substrate floating head 71 links to a gas distributing space 71c which is created inside the substrate floating head 71. For instance, the substrate floating head 71 comprises a dish-like receiver member which is concave toward inside and a disk-like lid member whose top surface 71a serves as a support surface which is opposed against the bottom surface of the substrate W, and as the lid member is fit into the receiver member, the gas distributing space 71c is created inside the substrate floating head 71. Further, a gas supply path 72a is provided inside the head support arm 72 axially along the vertical axis J, and the top end of the gas supply path 72a links to the gas distributing space 71c. Meanwhile, the bottom end of the gas supply path 72a is connected with the gas supplying unit 73 via a pipe 76 in which an on-off valve 75 is inserted.

The structure of the spin base 5 will now be described in detail with reference to FIGS. 1 and 2. The spin base 5 is provided with a dent 5a which is concave toward the inner side in its top central portion. The dent 5a is formed such that its plane size D1 is larger than the plane size D2 of the substrate floating head 71 and that its depth H1 in the up-down direction exceeds the depth H2 of the substrate floating head 71. Hence, when the substrate floating head 71 moves down, the substrate floating head 71 retracts into the dent 5a. Further, the top surface of a donut-like ring section surrounding the dent 5a is a surface-opposing-substrate which is faced against the bottom surface of the substrate W, and this opposing surface 5b is positioned parallel and facing the bottom surface of the substrate W at a predetermined distance from the bottom surface of the substrate W.

The gap between the inner wall surface of the rotation shaft 1 and the outer wall surface of the head support arm 72 defines a cylindrical gas supply path 11. The gas supply path 11 is connected with the gas supplying unit 73 via a pipe 15 in which an on-off valve 13 is inserted, and therefore, it is possible to supply the inert gas via the gas supply path 11 into the space between the bottom surface of the substrate W and the top surface of the spin base 5 as the on-off valve 13 opens and closes under control of the control unit 80.

Figure 3:
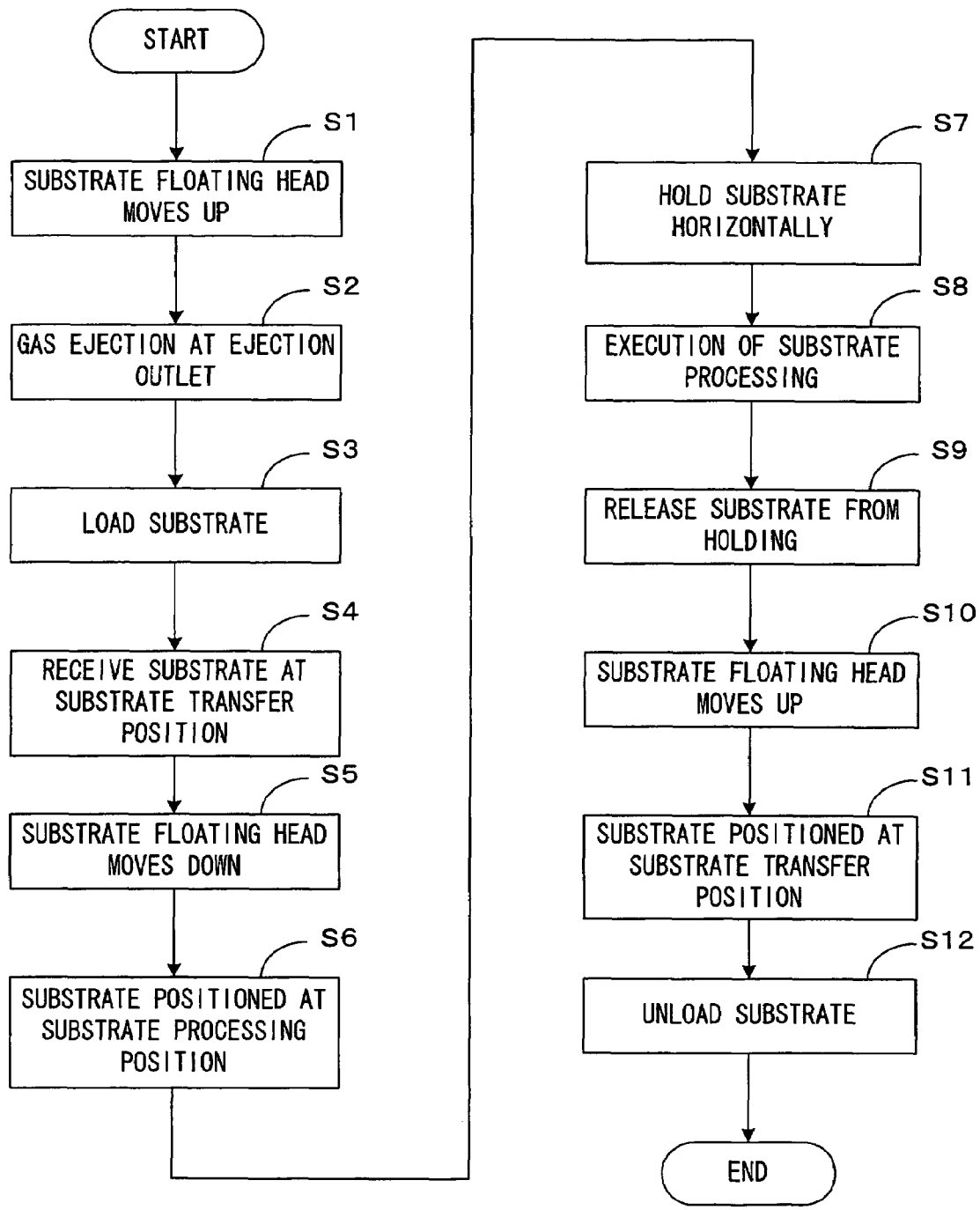
FIG. 3 is a flow chart of a substrate loading/unloading operation of the substrate processing apparatus which is shown in FIG. 1.

The substrate loading/unloading operation of loading and unloading the substrate W in the substrate processing apparatus having this structure will now be described with reference to FIG. 3. FIG. 3 is a flow chart of the substrate loading/unloading operation of the substrate processing apparatus which is shown in FIG. 1. First, the control unit 80 makes the actuator 74 ascend, thereby moving the substrate floating head 71 and the head support arm 72 upward as one integrated unit (Step S1). As the top surface 71a of the substrate floating head 71 moves to and stops immediately below a substrate transfer position P1 which is spaced upward from the spin base 5, the control unit 80 opens the on-off valve 75, and the inert gas is ejected upward at the gas ejection outlets 71b of the substrate floating head 71 (Step S2). This makes it possible for the substrate floating head 71 to receive the substrate W which has been transported to the substrate transfer position P1. The control unit 80 may move up the substrate floating head 71 during ejection of the inert gas after causing ejection of the inert gas at the gas ejection outlets 71*b,* or may move up the substrate floating head 71 at the same time as ejection of the inert gas.

Following this, as an unprocessed substrate W is loaded into the apparatus by the transportation arm of the substrate transportation robot or the like and transported to the substrate transfer position P1 (Step S3), the unprocessed substrate W is floated up by the inert gas ejected from the substrate floating head 71 which is located at the bottom surface of the substrate W. When the transportation arm of the substrate transportation robot pulls out or otherwise retracts away from the unprocessed substrate W, the unprocessed substrate W is handed to the substrate floating head 71 (Step S4). Owing to the inert gas supplied into the space which is created between the bottom surface of the substrate W and the top surface 71*a* of the substrate floating head 71 toward the bottom surface of the substrate W, the substrate W is supported by the substrate floating head 71 without contacting the substrate floating head 71. The hold pins 41A, 41B of the holders 4*a* through 4*d* disposed at the rim of the spin base 5 restrict the unprocessed substrate W from moving in the horizontal direction.

Next, the unprocessed substrate W as it is floated approximately horizontally at the substrate floating head 71 moves down as the control unit 80 moves down the actuator 74 (Step S5). At this stage, since the unprocessed substrate W descends while restricted from moving in the horizontal direction by the hold pins 41A, 41B, the substrate W is guided smoothly toward the substrate processing position P3 without flying out sideways from the substrate floating head 71. When the unprocessed substrate W arrives at the substrate processing position P3, the bottom rim portion of the substrate W engages with the support pins 3, and as the substrate floating head 71 moves down, the unprocessed substrate W is transferred to and mounted on the support pins 3. In this manner, the substrate W is positioned at the substrate processing position P3, and the bottom rim portion of the substrate W and the opposing surface 5*b* of the spin base 5 are arranged close to and facing each other (Step S6). In this embodiment, the hold pins 41A, 41B thus function as the "restrictor" of the invention.

Further, the substrate floating head 71 descends as such, and the entire substrate floating head 71 retracts into the dent 5*a* of the spin base 5. The control unit 80 then closes the on-off valve 75, which stops the supply of the inert gas from the substrate floating head 71. Alternatively, the control unit 80 may start the supply of the inert gas from the gas supply path 11 which will be described later and continue ejection of the inert gas from the substrate floating head 71, without stopping the supply of the inert gas from the substrate floating head 71.

The unprocessed substrate W mounted at the support pins 3 is held firmly in the horizontal direction, as the hold pins of the movable holders 4*c* 4*d* move to their substrate holding positions at which they abut on the edge surface of the substrate W (Step S7). Following this, the processing liquid is supplied from a processing liquid nozzle not shown to the top surface of the substrate W which rotates together with the spin base 5, thereby subjecting the top surface (non-device surface) of the substrate W and/or the rim portion (bevel portion) of the bottom surface (device surface) of the substrate W to predetermined processing (Step S8). As the control unit 80 opens the on-off valve 13 during the processing, the inert gas is supplied from the gas supply path 11 into the entire space which is created between the bottom surface of the substrate W and the top surface of the spin base 5 via the space which is created between the bottom surface of the substrate floating head 71 and the bottom surface of the dent 5*a.* The inert gas supplied into the space which is created between the bottom surface of the substrate W and the top surface of the spin base 5 flows outward along the diameter direction of the substrate W in the gap between the bottom rim portion of the substrate W and the opposing surface 5*b* which is in the rim portion of the spin base 5, which blocks the bottom surface (device surface) of the substrate W from the ambient atmosphere around the substrate W and prevents contamination of the bottom surface of the substrate W because of the processing liquid adhered to the bottom surface of the substrate W or the like.

Unloading of the processed substrate W is executed in the opposite order to that of loading of the unprocessed substrate W. After the predetermined processing for a predetermined period of time, the hold pins of the movable holders 4*c,* 4*d* move in the direction away from the edge surface of the processed substrate W and the substrate W is consequently released from holding (Step S9). Following this, the control unit 80 moves up the actuator 74, which causes the substrate floating head 71 which has retracted into the dent 5*a* to ascend while ejecting the inert gas at the gas ejection outlets 71*a* (Step S10). In this manner, the inert gas ejected from the substrate floating head 71 floats up the processed substrate W approximately horizontally. As the processed substrate W moves up to the substrate transfer position P1, the actuator 74 is stopped and the substrate W is positioned at this position (Step S11). The substrate floating head 71 can therefore hand the processed substrate W to the substrate transportation robot. By the transportation arm of the substrate transportation robot or the like, the processed substrate W is then discharged to outside the apparatus (Step S12).

As described above, in this embodiment, the substrate floating head 71 ascends and descends with the substrate W supported by the substrate floating head 71 without contacting the substrate floating head 71, and the substrate W is positioned to the substrate transfer position P1, which is above the substrate processing position P3, and the substrate processing position P3. Since the substrate W is handed at the substrate transfer position P1 which is above the substrate processing position P3, the condition while the substrate W is handed, for instance the height of the substrate transportation mechanism (transportation arm, etc.) along the up-down direction does not restrict the substrate processing position P3, and therefore, it is possible to position the substrate W to the desired substrate processing position. Hence, the position at which the spin base 5 (opposing surface 5*b*) and the substrate W are sufficiently close to each other can serve as the substrate processing position. Since it is possible to position the substrate W to the substrate processing position P3 at which the substrate W comes close to but does not contact the spin base 5, troubles such as damaging, contamination and the like of the bottom surface (device surface) of the substrate W.

Further, according to this embodiment, since the spin base 5 comprises in its top central portion the dent 5*a* whose plane size D1 is larger than the plane size D2 of the substrate floating head 71 and whose depth H1 in the up-down direction exceeds the depth H2 of the substrate floating head 71, the entire substrate floating head 71 retracts into the dent 5*a* as the substrate floating head 71 moves down. The substrate floating head 71 does not interfere with a reduction of the gap between the bottom surface of the substrate W and the spin base 5 (opposing surface 5*b*), and hence, the position at which the bottom surface of the substrate W and the spin base 5 (opposing surface 5*b*) are sufficiently close to each other can serve as the substrate processing position.

Still further, according to this embodiment, since the substrate W floated up by the substrate floating head 71 moves upward and downward while restricted by the hold pins 41A, 41B from moving in the horizontal direction, and the substrate W is smoothly guided to and positioned at the substrate transfer position P1 and the substrate processing position P3 without flying out sideways from the substrate floating head 71.

Figure 4:
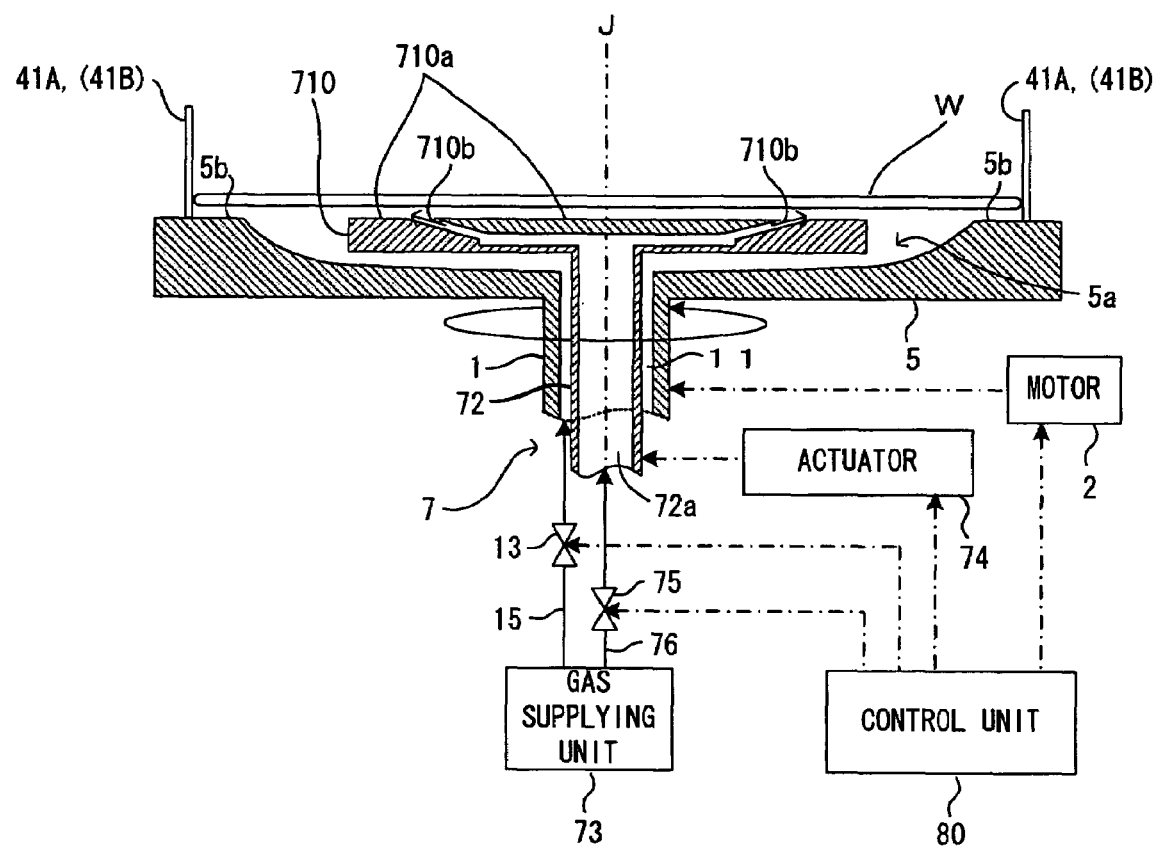
FIG. 4 is a drawing which shows other embodiment of the substrate processing apparatus according to the invention.
Figure 5:
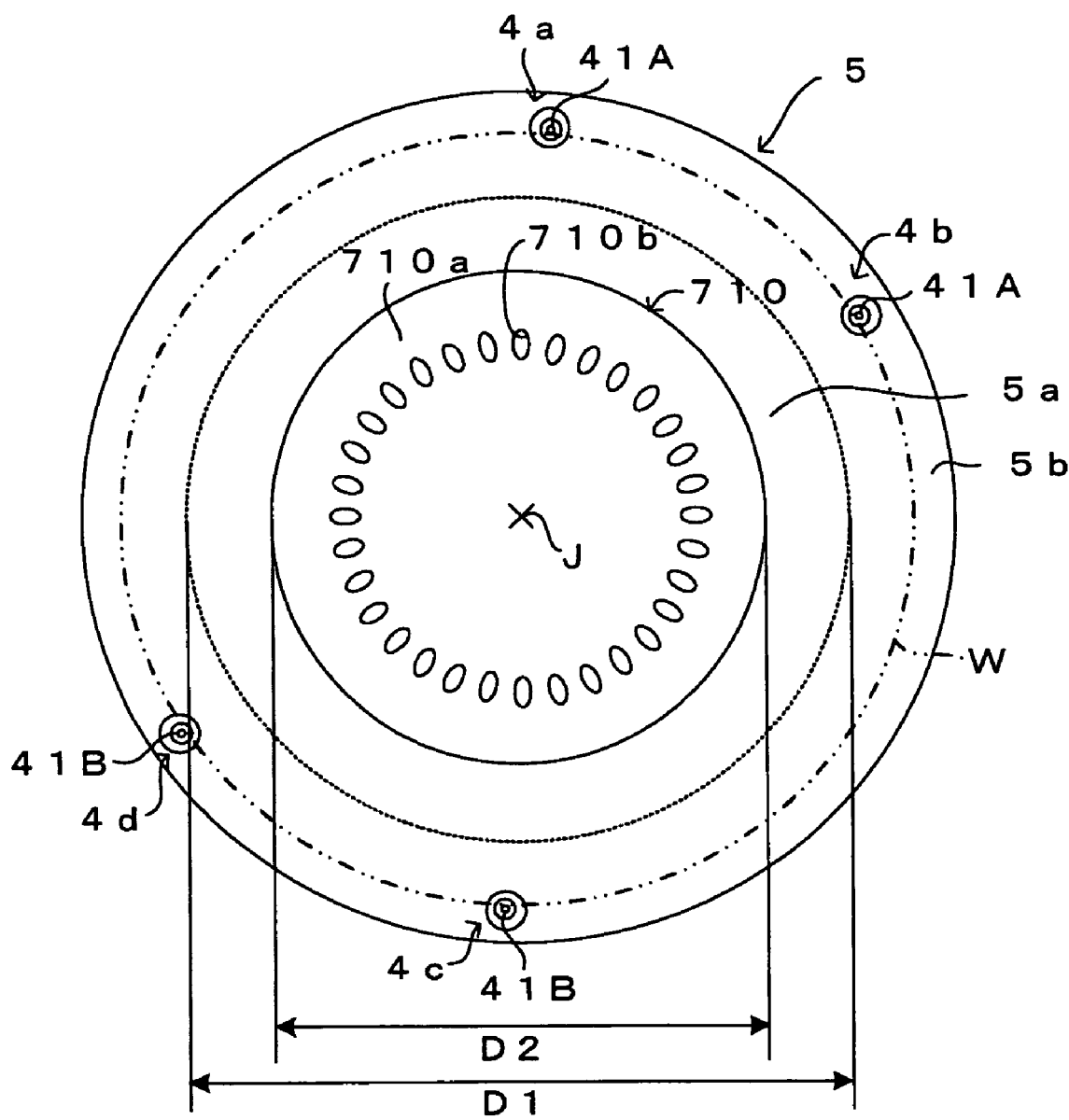
FIG. 5 is a plan view of the substrate processing apparatus of FIG. 4 as it is viewed from above.

FIG. 4 is a drawing which shows other embodiment of the substrate processing apparatus according to the invention. FIG. 5 is a plan view of the substrate processing apparatus of FIG. 4 as it is viewed from above. A major difference of this embodiment from the earlier embodiment is that the inert gas from a substrate floating head 710 toward the bottom surface of the substrate W is ejected in a different direction and that the support pins 3 are not necessary. This embodiment is otherwise basically similar in structure to the earlier embodiment. Hence, the same structures will be denoted at the same reference symbols but will not be described, and the characteristics of this embodiment will be described with a primary focus on differences.

In this embodiment, the direction in which the inert gas is ejected from the substrate floating head 710 toward the bottom surface of the substrate W is not an approximately vertical direction. Rather, the inert gas is ejected up toward the rim side of the substrate W. As shown in FIG. 5, plural gas ejection outlets 710b are formed in a rim portion in the top surface 710a (which correspond to the "support surface" of the invention) of the substrate floating head 710, and the gas ejection outlets 710b have oval shapes which elongate outward along the diameter in the top surface 710a. The gas ejection outlets 710b are formed so that the inert gas is ejected toward the rim side of the substrate W at a predetermined angle (which is preferably 20 through 40 degrees) with respect to the top surface 710a. As the inert gas is ejected from the substrate floating head 710 toward the bottom surface of the substrate W, the substrate W is floated as it is sucked to the top surface 710a by the Bernoulli effect.

Using this structure, in a similar manner to that according to the earlier embodiment, the substrate W is positioned at the substrate processing position P3 or the substrate transfer position P1 without contacting anywhere. In addition, in this embodiment, since the substrate W is sucked toward the substrate floating head 710 by the Bernoulli effect, the substrate W is transported stably as it is held approximately horizontally. This improves the reliability of transportation of the substrate W. For example, even when the edge surface of the substrate W and the hold pins 41A, 41B catch on each other while the substrate W is being positioned while restricted by the hold pins 41A, 41B from moving in the horizontal direction, the force which sucks the substrate W toward the substrate floating head 710 makes it possible to stably move the substrate W, as it is held approximately horizontally, together with the substrate floating head 710 as one integrated unit.

The substrate floating head 710 descends while the substrate W is being positioned to the substrate processing position P3, and when the substrate W reaches the substrate processing position P3, the substrate floating head 710 stops, and hence, the substrate W as such is positioned at the substrate processing position P3. This is because as the substrate floating head 710 sucks and floats up the substrate W, the substrate W is positioned along the up-down direction as it is spaced apart from the substrate floating head 710 by a predetermined distance. Positioning of the substrate W to the substrate processing position P3 therefore does not require substrate supporting members such as the support pins 3 on which the substrate W is mounted over a predetermined distance from the spin base 5.

The invention is not limited to the embodiments described above but may be modified in various manners in addition to the embodiments above, to the extent not deviating from the object of the invention. For instance, although the embodiments described above require moving the substrate floating head 71,710 upward and downward and positioning the substrate W at the substrate transfer position P1 and the substrate processing position P3, the spin base 5 may be moved upward while fixing the substrate floating head 71,710 to thereby position the substrate W. Alternatively, both the substrate floating head 71,710 and the spin base 5 may be moved upward so that the substrate W is positioned.

Further, although the entire substrate floating head 71,710 retracts into the dent 5a of the spin base 5 in the embodiments described above, this is not limiting. A lower portion of the substrate floating head 71,710 at least may go inside the dent 5a. In other words, during the process of positioning the substrate W to the predetermined substrate processing position P3, even if the top surface 71a, 710a of the substrate floating head 71,710 is outside the dent 5a, as long as the top surface 71a, 710a of the substrate floating head 71,710 remains lower than the bottom surface of the substrate W which has been positioned at the substrate processing position P3, similar effects to those according to the embodiments above are obtained.

<Substrated Processing System>

While the substrate processing apparatus of the invention may be used alone, the substrate processing apparatus of the invention may be combined with a substrate processing apparatus which performs other substrate processing, a substrate transportation unit which transports the substrate W or an indexer etc., to thereby build a substrate processing system. One example is the substrate processing system shown in FIG. 6 for instance. An embodiment of a substrate processing system according to the invention will now be described with reference to FIG. 6.

Figure 6:
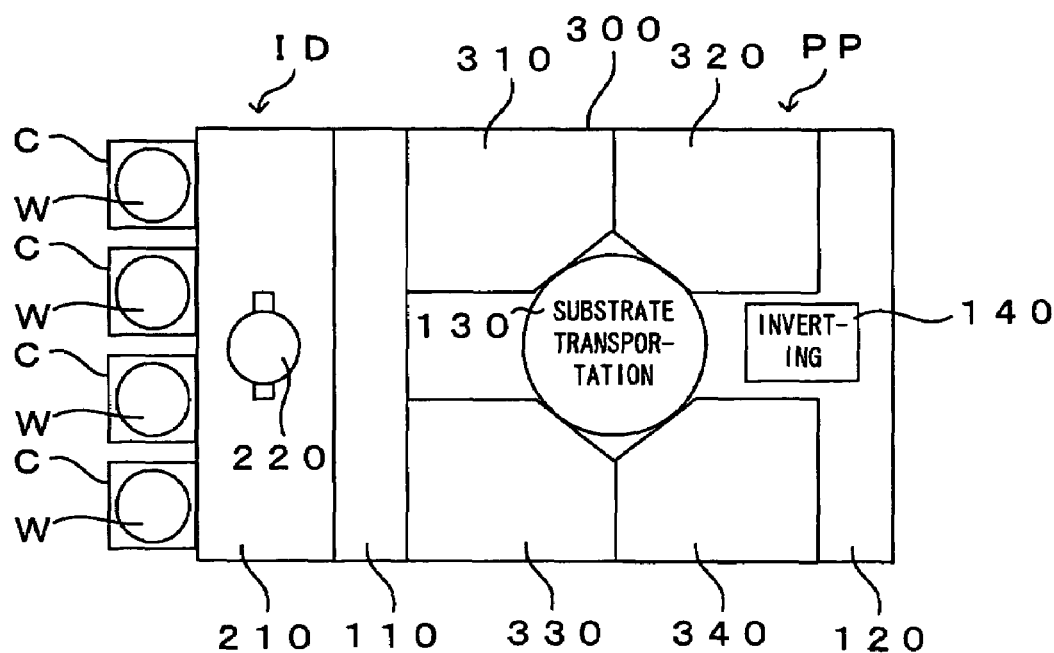
FIG. 6 is a drawing which shows an embodiment of a substrate processing system which is built using the substrate processing apparatus according to the invention.
Figure 6:
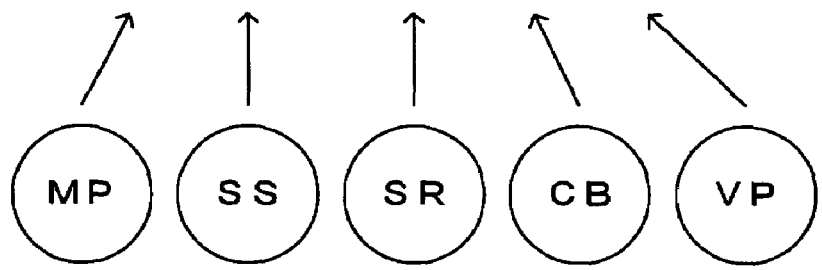

FIG. 6 is drawing which shows an embodiment of a substrate processing system which is built using the substrate processing apparatus according to the invention. This substrate processing system is a processing system of the single wafer type which is for treating a substrate W such as a semiconductor wafer with a processing liquid, processing gas, etc. This substrate processing system comprises a substrate processor PP which treats the substrate W, an indexer ID which is coupled with the substrate processor PP, and processing fluid boxes 110 and 120 in which structures for supplying/discharging processing fluids (liquid or gas) are housed.

The indexer ID comprises a cassette holder 210 which is capable of holding plural cassettes C (which may be pods which house airtight plural substrates W such as FOUPs (Front Opening Unified Pod), SMIF (Standard Mechanical Inter Face) pods, and OCs (Open Cassette) or the like) and an indexer robot 220 which accesses a cassette C held by the cassette holder 210 and carries an unprocessed substrate W out of the cassette C or carries a processed substrate W back into the cassette C. Each cassette C comprises plural racks (not shown) between which plural substrates W are held one atop the other with a very small distance from each other so that one substrate W can be held in each rack. Each rack, contacting the bottom rim portion of each substrate W, holds the substrate W from below, and the substrates W are housed approximately horizontally in the cassette C facing their front surfaces (device surfaces) up and their back surfaces down.

The substrate processor PP comprises a substrate transportation robot 130 which is disposed approximately at the center in a plane and a frame 300 to which the substrate transportation robot 130 is attached. To this frame 300, plural (four in this embodiment) unit arranging segments 310, 320, 330 and 340 are disposed, and further, a substrate inverting unit 140 is attached at such a position which permits an access by the substrate transportation robot 130.

Each of the unit arranging segments 310, 320, 330 and 340 can get any desired processing unit chosen from (a) a chemical processing unit MP which rotates the substrate W while holding the substrate W, supplies a chemical solution from a chemical solution nozzle to the substrate W and processes the substrate W, (b) a scrub cleaning unit SS which rotates the substrate W while holding the substrate W, supplies pure water to the substrate W and scrubs the surface of the substrate W with a scrub brush, (c) a polymer removing unit SR which rotates the substrate W while holding the substrate W, supplies a polymer removing liquid to the substrate W and removes residuals remaining on the substrate W, (d) a bevel cleaning unit CB which rotates the substrate W while holding the substrate W, supplies a processing liquid to the entire area of one surface of the substrate W or some area in the substrate W including the rim portion of the substrate W, and removes only those unwanted matters remaining in such an area, (e) a vapor cleaning unit VP which supplies vapor including a chemical solution or vapor including chemical gas to thus held substrate W and process the substrate W, besides a processing unit composed of the substrate processing apparatus according to the embodiment above. In short, the frame 300 is so structured to serve as a common platform to these multiple types (six types in this embodiment) of the processing units and to seat plural types (maximum four types) of the processing units in any desired combination. It is therefore possible to easily adapt to a process which is suitable to a new material, a process for finer structure, etc. Further, when seating two types of the processing units, the frame 300 may seat one processing unit of a first type and three processing units of a second type or two processing units of the first type and two processing units of a second type, in accordance with the processing tact time.

Since at least two types of the processing units together with the substrate transportation unit are built into one substrate processing system in this structure, it is possible to subject the substrate W successively to two or more types of processing within one substrate processing system. In this fashion, it is possible to favorably realize manufacturing of many models each in small volume. Further, where there is a demand for plural types of processing, successive processing of the substrates W improves the throughput.

The respective processing units (the chemical processing unit MP, the scrub cleaning unit SS, the polymer removing unit SR, the bevel cleaning unit CB and the vapor cleaning units VP) are based on a common base unit which has the identical structure as that of the substrate processing apparatus according to the embodiments above. Further, the substrate transfer position P1 which is common among the processing units is set, so that it is possible to transfer substrates W between the processing units and the substrate transportation robot 130 at this substrate transfer position P1. This ensures unchanged accesses by the substrate transportation robot 130, whichever processing unit is set to the substrate processor PP.

The substrate transportation robot 130 is capable of receiving an unprocessed substrate W from the indexer robot 220 and handing a processed substrate W to the indexer robot 220. The substrate transportation robot 130 can access the processing units which have been set to the unit arranging segments 310, 320, 330 and 340 and the substrate inverting unit 140 and can hand the substrate W to and receive the substrate W from these units.

To be more specific, the substrate transportation robot 130 comprises for instance a base stage which is fixed to the frame 300 of the substrate processor PP, an ascend/descend base which is attached to this base stage such that the ascend/descend base can move upward and downward, a rotary base which is attached to the ascend/descend base such that the rotary base can rotate about a vertical axis, and paired hands which are attached to the rotary base. The paired substrate holding hands can move forward and retract in the direction closer to and away from the axis of rotations of the rotary base. In the structure above, the substrate transportation robot 130 directs its substrate holding hands toward any one of the indexer robot 220, the processing units which have been set to the unit arranging segments 310, 320, 330 and 340 and the substrate inverting unit 140, moves its substrate holding hands forward or backward, and hands the substrate W to and receives the substrate W from them.

One of the paired substrate holding hands may be used to hold unprocessed substrate W and the other substrate holding hand may be used to the processed substrate W. Further, the paired substrate holding hands may operate, when handing the substrate W to and receiving the substrate W from the processing unit set to the indexer robot 220, the unit arranging segment 310, 320, 330 or 340 or the substrate inverting unit 140, such that one substrate holding hand receives the substrate W from the other and the other holding hand thereafter hands the substrate W to the other.

The indexer robot 220 unloads the unprocessed substrate W from any one of the cassettes C and gives the substrate W to the substrate transportation robot 130, and receives from the substrate transportation robot 130 the processed substrate W and houses the processed substrate W in the cassette C. The processed substrate W may be returned back to the cassette C which used to hold the substrate W when it was not yet processed, or alternatively, the cassettes C for unprocessed substrates W may be separated from the cassettes C for processed substrates W and a processed substrate W may be returned to a different cassette C than the cassette C which used to hold this substrate W when it was not yet processed.

Since the substrate transportation robot 130 loads the substrate W into the substrate inverting unit 140 where the substrate W is inverted upside down, both the device surface and the non-device surface of the substrate W are processed in the processing units which have been set to the unit arranging segments 310, 320, 330 and 340.

Since the substrate W is turned upside down between two types of the processing units in this structure, it is possible to subject the front and the back surfaces of the substrate W to the different processing provided by the two types of the processing units. It is therefore possible to optimally process each one of the front and the back surfaces of the substrate W. More particularly, as the substrate W is loaded into a certain processing unit and inverted and thus inverted substrate W is loaded into other processing unit and processed, the other surface of the substrate W is processed. The surfaces of the substrate W are thus each appropriately processed, whereby the both surfaces of the substrate W are processed favorably.

In the substrate processing system having this structure, as the indexer robot 220 transports the cassette C in which plural substrates W are housed facing their front surfaces (device surfaces) up to the indexer ID, each substrate W is processed in the following manner. An operation of this system will now be described, in relation to an example that the substrate processing apparatus according to the embodiment above is set as one processing unit to the unit arranging segment 310 and this processing unit processes the back surface (the non-device surface) of the substrate W and/or the rim portion of the front surface (the device surface) of the substrate W.

First, the indexer robot 220 unloads the substrate W facing its front surface directed to above from the cassette C, and after the substrate W is handed to the substrate transportation robot 130, the substrate transportation robot 130 transports the substrate W to the substrate inverting unit 140 (loading). Receiving the substrate W, the substrate inverting unit 140 turns the substrate W upside down and thereafter gives to the substrate transportation robot 130 the substrate W whose device surface is directed to below. The substrate transportation robot 130 loads the substrate W to the processing unit which has been set to the unit arranging segment 310.

To receive the unprocessed substrate W from the substrate transportation robot 130 at this substrate transfer position P1, the substrate floating head 71 ascends within this processing unit, and with the inert gas accordingly ejected, the processing unit prepares for receipt of the substrate W. Receiving the unprocessed substrate W from the substrate transportation robot 130 at this substrate transfer position P1, the processing unit executes the same operation as that performed by the substrate processing apparatus according to the embodiments above, thereby positioning the substrate W to the substrate processing position P3 and cleaning the top surface (the non-device surface) of the substrate W and/or the rim portion (bevel portion) of the bottom surface (the device surface) of the substrate W. Since the substrate W can be positioned at the substrate processing position P3 which is close to the base member without contacting the base member as in the substrate processing apparatus above, it is possible to prevent troubles such as damaging of the bottom surface (the device surface) of the substrate W and contamination of the bottom surface of the substrate W caused by the processing liquid adhering to the bottom surface of the substrate W.

Upon completion of cleaning, the substrate floating head 71 which has retracted into the dent 5a ascends and receives the processed substrate W from the support pins 3, and then moves up to the substrate transfer position P1 and positions the processed substrate W at the substrate transfer position P1. (In the event that the substrate W is processed as it is sucked and floated up by the Bernoulli effect, the processed substrate W is moved up to and positioned at the substrate transfer position P1.) The substrate transportation robot 130 receives the processed substrate W at the substrate transfer position P1, and transports the substrate W to the substrate inverting unit 140. The substrate transportation robot 130 receives the substrate W which has been set facing its front surface up by the substrate inverting unit 140, and after the substrate W is handed to the indexer robot 220, the indexer robot 220 return the substrate W back to the cassette C (unloading). When this processing by the processing unit is to be immediately followed by other processing, in accordance with the content of the other processing, the substrate transportation robot 130 transports the substrate W facing its front surface downward directly to the other processing unit (the chemical processing unit MP, the scrub cleaning unit SS, the polymer removing unit SR, the bevel cleaning unit CB or the vapor cleaning units VP), or transports the substrate W to the substrate inverting unit 140, makes the substrate W turned upside down there, and thereafter transports the substrate W to the other processing unit.

As described above, in the substrate processing apparatus according to the embodiments above, since substrate W is transferred at the substrate transfer position P1 where it is set corresponding to the substrate processing system and which is located above the substrate processing position P3, it is easy for the substrate transportation robot 130 to transfer the substrate W. Further, since it is possible to transfer the substrate W at the substrate transfer position P1 and position the substrate W at the desired substrate processing position, the substrate processing apparatus is preferable as a processing unit which performs plural different types of processing. In other words, the substrate processing apparatus according to the embodiments above is highly versatile as a processing unit and has an advantage that it is easy to set various types of processing units to the unit arranging segments 310, 320, 330 and 340. In addition, since it is possible to position the substrate W at the substrate processing position P3 which is close to the base member without contacting the base member, it is possible to efficiently prevent troubles such as damaging, contamination and the like of the bottom surface of the substrate W. This enhances the accuracy of processing the substrate W.

Further, in the substrate processing apparatus according to the embodiments above, since the substrate W is transferred at the substrate transfer position P1 and positioned at the substrate processing position P3, the following effects are attained. That is, while positioning the substrate W at the substrate processing position P3 which is close to the base member is desirable for the sake of a better processing accuracy, in the event that the substrate W is to be positioned directly at the substrate processing position P3, it is difficult to use a widely used substrate transportation mechanism which inserts a substrate transportation mechanism such as a transportation arm into the space which is created between the bottom surface of the substrate W and the base member and transfers the substrate W to the support pins. This gives rise to a constraint that the substrate transportation mechanism needs be a special one, which in turn ruins the versatility of the substrate processing apparatus.

An apparatus which processes the back surface (the non-device surface) of the substrate W or the rim portion of the front surface (the device surface) of the substrate W for instance may use the following method, for the purpose of transporting the substrate W to the substrate processing position which is close to the base member without contacting the base member. That is, by means of a transportation mechanism which comprises a rod-like arm whose one end is linked to a revolving shaft such that the arm can freely revolve and a substrate holder which abuts on the rim portion of the substrate W and holds the substrate W at the other end of the arm with the longitudinal direction of the arm approximately coincided with the diameter direction of the substrate W, the substrate W held by the substrate holder with its front surface facing up is turned upside down as the arm revolves 180 degrees about the revolution shaft, and the substrate W is moved close to and mounted on the base member with its front surface thus facing down (i.e., the device surface directed down).

However, since this transportation method necessitates revolving the arm in order to transport the substrate W, a very wide area is needed. This increases the footprint of the apparatus, a chamber shutter which blocks the atmosphere inside and outside the substrate processing apparatus, etc. Further, this requires a complex structure for the transportation mechanism, which serves to increase costs. Still further, when a substrate processing system is to be built by combining processing units which process the substrate W with its front surface facing up with processing units which process the substrate W with its front surface facing down, transportation is not possible by the transportation method above.

Meanwhile, in the substrate processing apparatus, since the substrate W is handed to and received from the substrate transportation robot 130 at the substrate transfer position P1 which is located above the substrate processing position P3, even when a position at which the substrate W and the base member are close to each other is used as the substrate processing position P3, it is not necessary to introduce a special transportation mechanism. It is therefore possible to use a transportation mechanism having a simple structure such as a transportation arm. Further, since the transportation arm needs not be revolved or otherwise operated, a transportation path for the transportation arm is limited, and therefore, the chamber shutter and the like may be small.

Although the substrate processing system according to the embodiment above is equipped with four processing units as the processing units, the number and the arrangement of the processing units may be determined freely. Further, any substrate processing system attains the effects described above as long as the substrate processing system comprises at least a processing unit whose structure is identical to that of the substrate processing apparatus according to the embodiment above and a transportation unit which transports a substrate to this processing unit. Hence, the substrate processing system may further comprise other units in addition to this processing unit and the transportation unit.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus which performs predetermined processing on a substrate which is positioned approximately horizontally at a substrate processing position, comprising:

a base member which is provided underneath said substrate positioned at said substrate processing position and which is distanced from said substrate by a predetermined distance;

a motor which drives said base member to rotate about a vertical axis;

a substrate floating device which includes a substrate floating head and which ejects out gas toward a bottom surface of said substrate at an ejection outlet which is formed in a support surface of said substrate floating head, thereby floating up said substrate approximately horizontally, said support surface which is faced against the bottom surface of said substrate; and an upward/downward driver which drives said substrate floating head along an up-down direction relative to said base member, thereby moving said substrate floated up by said substrate floating head to a substrate transfer position, which is located above said substrate processing position and at which a distance between said base member and said substrate positioned at said substrate transfer position is larger than a distance between said base member and said substrate positioned at said substrate processing position, and to said substrate processing position and positioning said substrate at said substrate transfer position and said substrate processing position, wherein said base member has a dent which is formed in a top central portion thereof, said dent having a plane size which is larger than a plane size of said substrate floating head, and wherein said base member rotates in a state that at least a lower portion of said substrate floating head retracts into said dent.

2. The substrate processing apparatus of claim 1, wherein a size of a depth of said dent is larger than a size of a height of said substrate floating head along an up-down direction, and when said substrate floating head moves down, said substrate floating head as a whole retracts into said dent.

3. The substrate processing apparatus of claim 1, further comprising a restrictor which restricts said substrate from moving horizontally, wherein said upward/downward driver moves said substrate floating head relative to said base member while said restrictor restricts said substrate floated up by said substrate floating head from moving horizontally, and said substrate is consequently moved to and positioned at said substrate transfer position and said substrate processing position.

4. The substrate processing apparatus of claim 1, wherein said substrate floating head ejects out said gas to above toward the bottom surface of said substrate and toward a rim side of said substrate, and said substrate is sucked close to said support surface and floated up by a Bernoulli effect.

* * * * *